United States Patent [19]
Hegde et al.

[11] Patent Number: 6,136,682
[45] Date of Patent: *Oct. 24, 2000

[54] METHOD FOR FORMING A CONDUCTIVE STRUCTURE HAVING A COMPOSITE OR AMORPHOUS BARRIER LAYER

[75] Inventors: Rama I. Hegde, Austin; Dean J. Denning, Del Valle; Jeffrey L. Klein; Philip J. Tobin, both of Austin, all of Tex.

[73] Assignee: Motorola Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/954,149

[22] Filed: Oct. 20, 1997

[51] Int. Cl.$^7$ ................................................ H01L 21/4763
[52] U.S. Cl. .......................... 438/622; 438/643; 438/644; 438/648; 438/687; 204/192.15
[58] Field of Search ..................... 438/644, 656, 438/648, 622, 643, 653, 654, 685, 687; 204/192.15

[56] References Cited

U.S. PATENT DOCUMENTS

| | | | |
|---|---|---|---|
| 5,302,537 | 4/1994 | Strack | 438/40 |
| 5,391,517 | 2/1995 | Gelatos et al. | 437/190 |
| 5,414,301 | 5/1995 | Thomas | 257/740 |
| 5,447,908 | 9/1995 | Itozaki et al. | 505/239 |
| 5,545,925 | 8/1996 | Hanaoka | 257/755 |
| 5,585,300 | 12/1996 | Summerfelt | 438/60 |
| 5,622,305 | 4/1997 | Bacon et al. | 228/123.1 |
| 5,668,411 | 9/1997 | Hong et al. | 257/751 |
| 5,714,418 | 2/1998 | Bai et al. | 438/627 |
| 5,739,579 | 4/1998 | Chiang et al. | 257/635 |
| 5,744,394 | 4/1998 | Iguchi et al. | 438/276 |
| 5,756,390 | 5/1998 | Juengling et al. | 438/439 |
| 5,760,480 | 9/1995 | You et al. | 257/783 |
| 5,849,367 | 12/1998 | Dixit et al. | 427/535 |
| 5,851,367 | 12/1998 | Nguyen et al. | 204/192.34 |
| 5,956,612 | 9/1999 | Elliott et al. | 438/637 |

OTHER PUBLICATIONS

J.M. Steigerwald, et al., "Surface Layer Formation During The Chemical Mechanical Polishing Of Copper Thin Films", Mat. Res. Soc. Symp. Proc. vol. 337, 1994 Materials Research Society, pp. 133–138.

*Primary Examiner*—Wael Fahmy
*Assistant Examiner*—Kurt Eaton
*Attorney, Agent, or Firm*—Keith E. Witek; Sandra L. Godsey; George R. Meyer

[57] ABSTRACT

A method for forming an improved copper barrier layer begins by providing a silicon-containing layer (10). A physical vapor deposition process is then used to form a thin tantalum nitride amorphous layer (12). A thin amorphous titanium nitride layer (14) is then deposited over the amorphous tantalum nitride layer. A collective thickness of the tantalum nitride and titanium nitride layers 12 and 14 is roughly 400 angstroms or less. A copper material 16 is then deposited on top of the amorphous titanium nitride wherein the composite tantalum nitride layer 12 and titanium nitride layer 14 effectively prevents copper from diffusion from the layer 16 to the layer 10.

19 Claims, 4 Drawing Sheets

METHOD FOR FORMING A CONDUCTIVE STRUCTURE HAVING A COMPOSITE OR AMORPHOUS BARRIER LAYER

FIELD OF THE INVENTION

The present invention relates generally to semiconductor manufacturing, and more particularly to, a titanium nitride (TiN) and a tantalum nitride (TaN) composite barrier layer for copper metalization on an integrated circuit (IC).

BACKGROUND OF THE INVENTION

In the integrated circuit (IC) industry, copper has been recently proposed for use as a metallic interconnect for integrated circuits. Copper is preferred over traditional aluminum interconnects since copper has improved stress and electromigration properties, and reduced resistivity over that available when using aluminum interconnects. Unfortunately, copper readily diffuses through silicon-containing layers, such as single crystalline silicon and silicon dioxide, potentially effecting dielectric constants of insulating material and impairing electrical operation of transistors. Currently, optimal barrier materials for use within copper interconnects are being researched by the integrated circuit industry.

One copper barrier layer which has been proposed for use in the integrated circuit industry is a titanium/titanium nitride/titanium (Ti/TiN/Ti) barrier. A problem with this composite barrier layer is that step coverage of titanium is not adequate for integrated circuit processing and does not obtain high yields. In addition, the titanium/titanium nitride/titanium process requires three different deposition steps. In addition, the titanium portion of the composite barrier stack is exposed to copper resulting in a titanium-to-copper chemical interaction which changes the resistivity of the metallic interconnect. In addition, titanium nitride films used in this type of barrier layer are usually crystalline in nature whereby optimal copper containment is not obtained. Therefore, an alternative barrier to the titanium/titanium nitride/titanium barrier is desired in the industry.

Titanium nitride used in isolation has been proposed for use as a copper barrier layer. However, titanium nitride by itself has poor adhesion to copper. In addition, once deposited in isolation titanium nitride is formed in a crystalline manner whereby crystalline barriers are less effective at containing copper. In addition, a titanium nitride barrier used in isolation compromises step coverage compared to other barrier materials in high aspect ratio features as when sputter deposited.

FIG. 1 illustrates an Auger depth profile of a copper interconnect structure utilizing 400 angstroms of titanium nitride as a barrier layer. FIG. 1 has an X-axis which shows the position of the titanium nitride layer between zero and 400 angstroms. To the left of the 400 angstrom thick titanium nitride barrier is the copper interconnect material. To the right of the 400 angstrom titanium nitride barrier in FIG. 1 is the silicon-containing layer. A 400 angstrom titanium nitride barrier, as illustrated in FIG. 1, was stressed at 400° C. for three hours. The annealing process of stressing the configuration at temperature over time is to accelerate the effects of copper diffusion and thus simulate a worst case condition. As can be seen in FIG. 1, copper atoms from the copper interconnect material, on the left of FIG. 1, readily diffused through the 400 angstrom titanium nitride barrier to penetrate into the silicon layer, as illustrated toward the right hand portion of FIG. 1. Therefore, FIG. 1 illustrates that a titanium nitride barrier of a thickness of 400 angstroms is not an adequate barrier for copper. While the thickness of the titanium nitride layer can be increased in order to improve barrier properties, the titanium nitride layer, while being conductive, is much more resistive than copper. Therefore, any thickening of the titanium nitride layer in an attempt to improve copper-containment will result in an increase in the resistivity of the metallic interconnect which is disadvantageous. Therefore, titanium nitride used in isolation is not optimal for use as a barrier layer.

FIG. 2 illustrates the use of a tantalum nitride barrier layer in isolation. FIG. 2 illustrates an X-axis where to the left of the zero mark of the X-axis is located a copper interconnect material. Between the zero point and the 400 angstrom point of the X-axis is located a tantalum nitride barrier. To the right of the 400 angstrom mark in FIG. 2 lies the silicon-containing integrated circuit layer. Through Auger depth profile measurements, FIG. 2 illustrates that copper can readily diffuse through the 400 angstrom thick tantalum nitride barrier layer after being stressed at 400° C. for three hours. Again, the annealing is used to simulate a worst case condition of accelerated copper diffusion. Therefore, FIG. 2 illustrates that tantalum nitride in isolation as a barrier layer is not overly effective.

Therefore, a need exists in the industry for an improved barrier layer between copper and silicon-containing layer in the integrated circuit industry.

Figure 1:
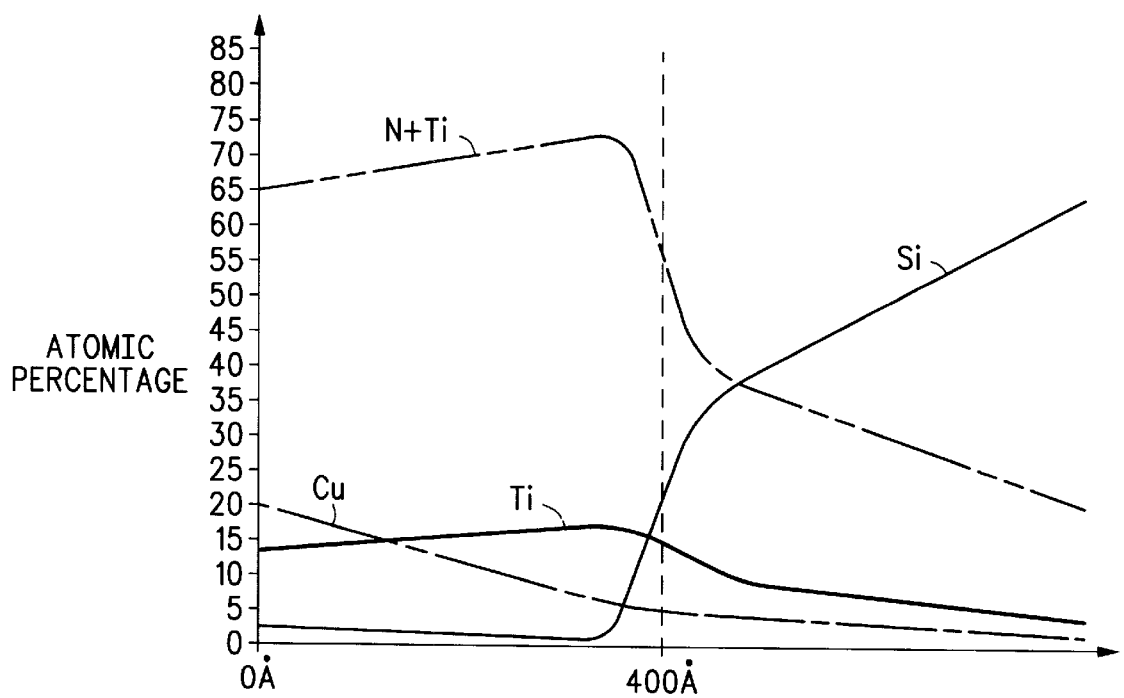
FIG. 1 illustrates, in an Auger X-Y depth profile, copper diffusion through an titanium nitride copper barrier accordance with the prior art.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE PRESENT INVENTION

Generally, the present invention is a composite barrier layer for use in copper integrated circuit interconnects. The composite barrier taught herein comprises both titanium nitride and tantalum nitride. In preferred form, the tantalum nitride is deposited first, followed by the deposition of the titanium nitride. The thickness of the entire composite layer is roughly equal to 400 angstroms or less. The tantalum nitride deposits in an amorphous state and the titanium nitride is physical vapor deposited on top of this amorphous tantalum nitride. Due to the presence of the tantalum nitride, the titanium nitride, which usually deposits in a crystalline structure, will mimic the amorphous tantalum nitride structure and thus be deposited in an amorphous state which improves barrier properties.

Figure 2:
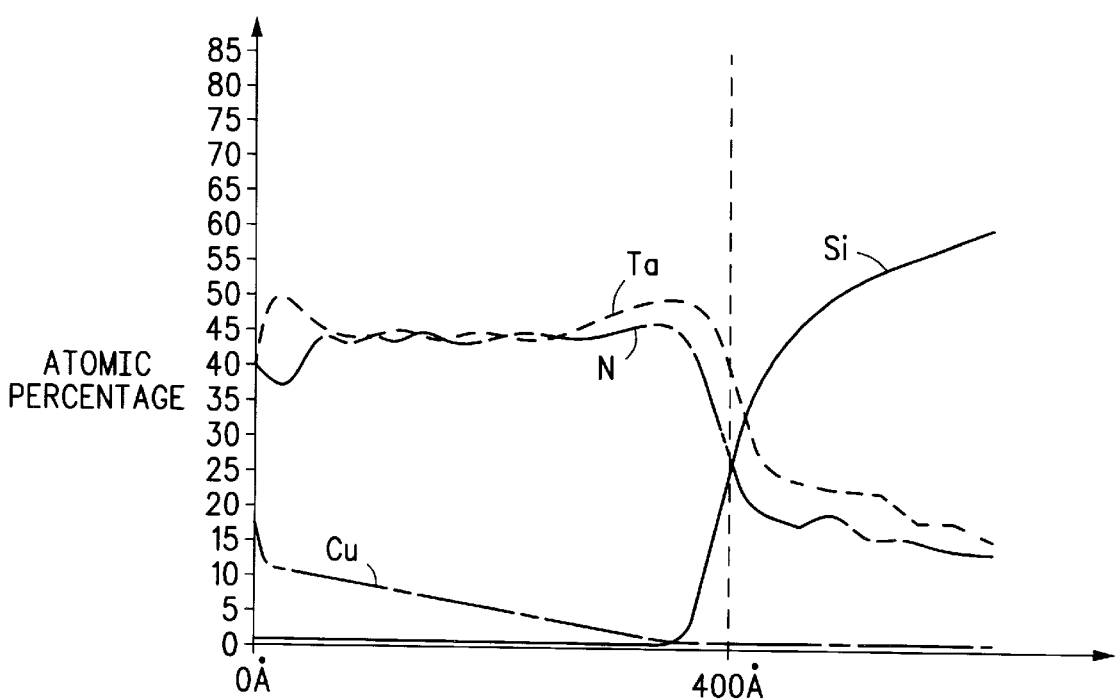
FIG. 2 illustrates, in an Auger X-Y depth profile, copper diffusion through a tantalum nitride barrier in accordance with the prior art.

Experiments have shown that a 400 angstrom composite titanium nitride and tantalum nitride film stressed at 450° C. for three hours shows no measurable copper diffusion from an overlying copper layer through the TaN/TiN film into an underlying silicon-containing layer such as SiO2, polysilicon, amorphous silicon, or single crystalline silicon. Therefore, this composite TaN/TiN film stack results in an excellent barrier to copper diffusion over greater thermal ranges than available in the prior art. Referring to FIGS. 1 and 2, a 400 angstrom total thickness TaN/TiN layer completely suppressed copper diffusion at excessive temperatures, whereas the prior art FIGS. 1 and 2 clearly illustrate that 400 angstroms of titanium nitride and tantalum nitride alone could not achieve these results. Therefore, there is an unexpected benefit to the TaN/TiN combination, since neither 400 angstroms of tantalum nitride nor 400 angstroms of titanium nitride used in isolation obtain the same benefit as a composite stack of tantalum nitride and titanium nitride at a same thickness.

Furthermore, the tantalum nitride and titanium nitride can be deposited in-situ along with copper in a multi-chamber system, thereby improving throughput. Throughout the experimentation, no copper peeling from the barrier layer was observed, indicating that adhesion is adequate. The avoidance of forming a crystalline structure of titanium nitride is accomplished due to the presence of the underlying amorphous tantalum nitride layer; the amorphous formation of titanium nitride is advantageous. It has been shown that the amorphous titanium nitride layer is a superior barrier to the crystalline titanium nitride barrier of the prior art. In addition, thinner barrier layers can be obtained using the composite barrier layer taught herein when compared to the prior art. Therefore, this composite barrier layer promises to reduce resistivity of copper interconnects while simultaneously providing adequate copper containment. Furthermore, the copper interconnects taught herein may be exposed to greater temperature stresses for longer periods of time without failure as clearly indicated by the data taught herein and illustrated in FIGS. 1–3.

Figure 3:
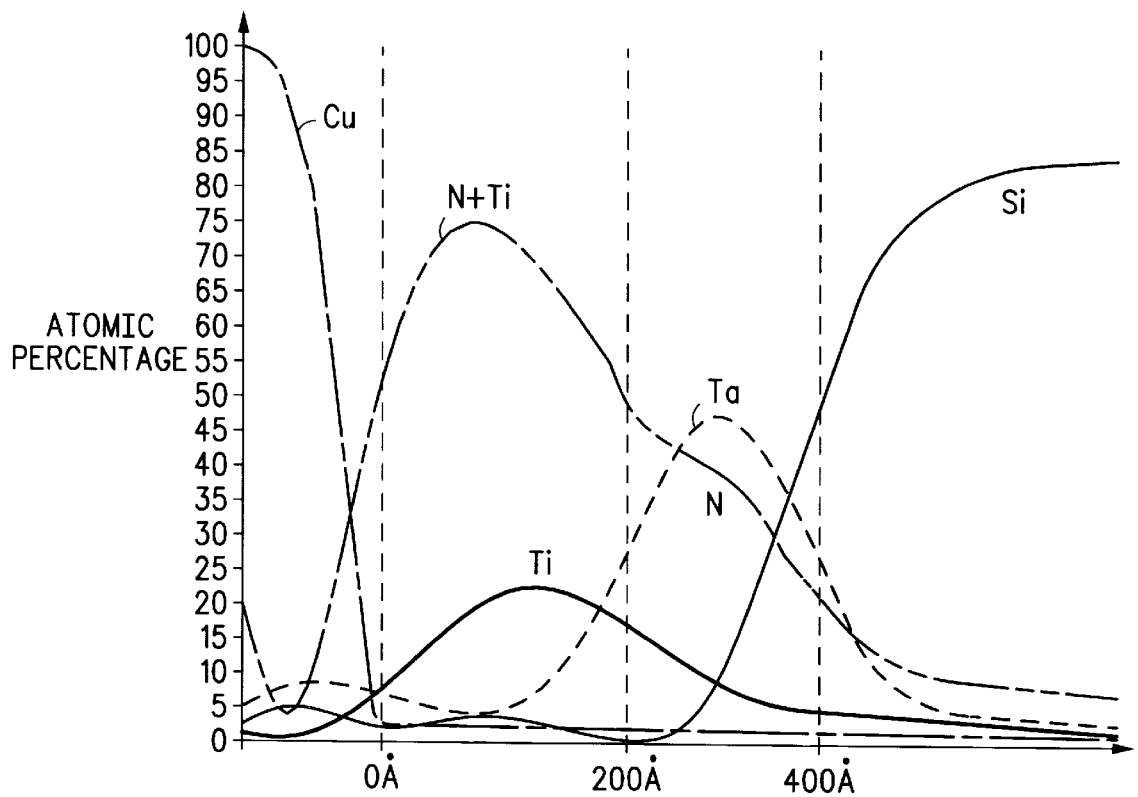
FIG. 3 illustrates, in an Auger X-Y depth profile, a composite titanium nitride and tantalum nitride barrier material which is improved over the prior art in accordance with the present invention.

The invention can be further understood with reference to FIGS. 3–10. FIG. 3 illustrates an Auger depth profile of the titanium nitride and tantalum nitride barrier for comparison to the prior art barriers of FIGS. 1 and 2. The X-axis of FIG. 3 identifies the depth in angstroms; and specifically zero angstrom, 200 angstroms, and 400 angstroms depths through the barrier stack are noted. The depth profile corresponds to a structure having a silicon-containing layer or interlayer dielectric layer (ILD), a TaN/TiN barrier layer overlying the silicon layer, and a metallic interconnect layer overlying the barrier layer. Note that in this configuration the barrier layer is effectively sandwiched between the metal and ILD to prevent diffusion of the metallic material into the ILD layer.

Continuing with FIG. 3, specifically, the metallic interconnect layer is identified to the left of the 0 angstrom mark and effectively defines the origin of the depth profile. As an example, the metallic interconnect layer may represent copper or copper alloy. The barrier layer is located at depths from 0 angstrom to 400 angstrom, where 0–200 angstroms defines the titanium nitride amorphous barrier region and 200–400 angstroms defines the amorphous seed layer, which is preferably a tantalum nitride layer or a tantalum silicon nitride layer. Finally, the silicon-containing layer is located at depths to the right of 400 angstroms. According to one embodiment of the present invention, the silicon-containing layer is a silicon dioxide material. In an alternate embodiment, the silicon-containing layer is a polysilicon layer or amorphous silicon layer. In still another embodiment, the silicon-containing layer is a single crystalline silicon material.

FIG. 3, illustrates high atomic concentrations of copper in depths corresponding to the metal interconnect region, while the atomic concentration of copper diminishes with increasing depth (i.e. distance away from the metallic interconnect layer). Likewise, FIG. 3 illustrates high concentrations of silicon in the silicon-containing region. The silicon-containing region in one embodiment is an interlayer dielectric (ILD) region. The barrier film is located between these two regions. Ideally, the barrier separates the metallic interconnect (e.g. copper) from the silicon-containing region, prohibiting diffusion of copper. FIG. 3 clearly illustrates that the composite barrier material comprised of titanium nitride and tantalum nitride is an effective copper barrier as copper does not diffuse through the barrier to contaminate the silicon region. As illustrated in FIG. 3, after annealing to stress the material, some copper diffuses into the barrier layer, but decreases to a negligible amount between 0 and 200 angstroms into the barrier. The silicon-containing region begins at 400 angstroms, however, as illustrated in FIG. 3, some silicon is found in the barrier layer from around 300 angstroms. Clearly the copper found within the barrier layer is not found at depths where silicon is found (i.e. the copper and silicon are adequately isolated). FIG. 3 illustrates the capabilities of the present invention whereby copper diffusion is prevented by using a TaN/TiN barrier layer of approximately 400 angstroms in thickness.

Figure 4:
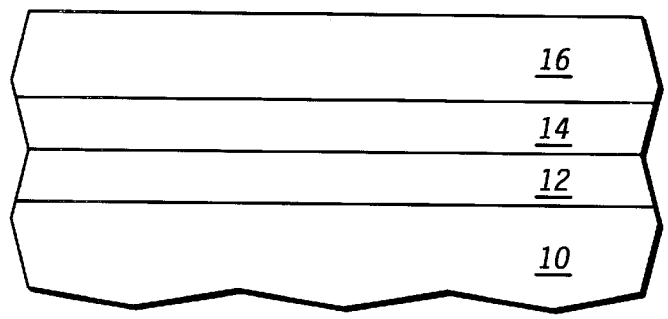
FIG. 4 illustrates, in a cross-sectional diagram, a composite titanium nitride and tantalum nitride amorphous barrier stack in accordance with the present invention.

FIG. 4 illustrates, in a cross-sectional diagram, the basic barrier and metallic stack which is being proposed for use in copper interconnects. FIG. 4 illustrates a silicon or silicon dioxide material 10, which in general, can be any layer containing silicon atoms to any substantial degree. FIG. 4 illustrates that an amorphous tantalum nitride (TaN) layer is formed on top of the silicon-containing layer 10 in FIG. 4. The amorphous layer 12 is preferably a tantalum nitride material or a tantalum silicon nitride material but can be any other amorphous barrier material. According to one embodiment of the present invention, the amorphous layer 12 is titanium silicon nitride, and according to another embodiment is molybdenum silicon nitride.

However, it is important to note that the layer 12 can be any amorphous barrier layer. Preferably, the layer 12 is formed by physical vapor deposition (PVD). Preferably, the layer 12 of FIG. 4 is formed to a thickness between roughly 20 angstroms and 200 angstroms.

The tantalum nitride layer is formed by providing a tantalum target within a processing chamber. A nitrogen source gas is provided within the processing chamber during the physical sputtering process, whereby tantalum being sputtered from the target comes into contact with nitrogen in the processing ambient. Through this process, tantalum nitride is deposited on the surface of the silicon-containing layer 10 to form the thin amorphous tantalum nitride layer 12 in FIG. 4.

After formation of the layer 12, another portion of the barrier layer 14 is deposited over the layer 12. Preferably, the layer 14 is another amorphous layer of material different from the layer 12. In a preferred form, the layer 14 is a titanium nitride layer which is deposited in an amorphous state due to the presence of the amorphous layer 12. It is important to note that titanium nitride usually deposits in a crystalline form. However, due to the presence of the amorphous layer 12, the titanium nitride in FIG. 4 deposits in an amorphous state since this material will mimic the amorphous state of the underlying layer 12. Preferably, the titanium nitride layer 14 is deposited to a thickness between roughly 20 angstroms and 200 angstroms. It is important to note that there is a trade off between copper containment and resistivity as the titanium nitride layer is either thickened or thinned for various process applications. The present invention increases the copper containment capabilities of a barrier layer without a need to increase the thickness (i.e. without the need to increase resistivity).

The titanium nitride layer 14 is preferably formed by providing a titanium target in a processing chamber. A nitrogen source gas is provided into the processing chamber whereby titanium atoms which are being sputtered from the target are nitrided and deposited on the surface of the wafer to form the layer 14 in FIG. 4.

After the formation of the composite to material barrier layer 12 and 14 in FIG. 4, a copper material 16 is sputtered. It is important to note, that the processing taught herein may be subsequently changed to chemical vapor deposition (CVD) instead of physical vapor deposition (PVD), however, PVD is preferred. As illustrated in FIG. 3, and as compared to FIGS. 1 and 2, the structure of FIG. 4 effectively prevents copper atoms in layer 16 from contaminating the silicon-containing layer 10.

Figure 5:
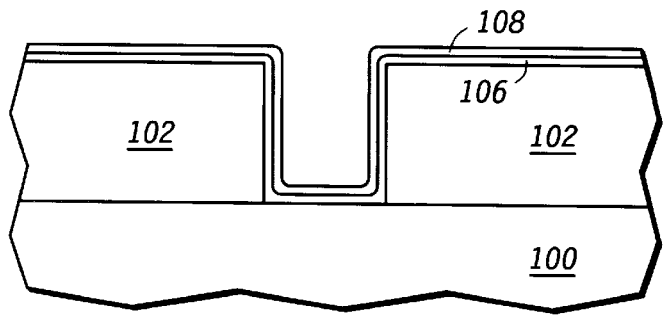
FIGS. 5–10 illustrate, in cross-sectional diagrams, a process flow used to form inlaid and dual inlaid structures using a composite barrier layer and copper interconnect in accordance with the present invention.

FIGS. 5–10 illustrate how the composite barrier taught in FIG. 4 can be integrated into inlaid structures and dual inlaid structures to form effective copper interconnects for an integrated circuit. FIG. 5 illustrates a substrate layer 100. Over the substrate layer 100 is formed a dielectric layer 102 which is preferably a tetraethylorthosilicate (TEOS) layer. It is important to note that the layer 102 can be any one of ozone TEOS, furnace TEOS, a silane CVD oxide, fluorinated oxides, low k dielectrics, composites thereof, or the like. Layer 102 forms an interlayer dielectric (ILD). Conventional photolithographic processing and etching is used to form an opening through the layer 102 in FIG. 5 in order to expose the substrate material 100. Layer 100 may be a metallic layer, a conductive plug region, or a doped semiconductor region.

After formation of the opening, a first barrier material 106 is deposited. The material 106 in FIG. 5 is analogous to the layer 12 of FIG. 4 whereby the layer 106 is an amorphous barrier material. Preferably, the layer 106 is an amorphous tantalum nitride (TaN) or tantalum silicon nitride layer.

After formation of the first amorphous barrier layer 106, a second amorphous barrier layer 108 is formed. As discussed in FIG. 4, the layer 108 is analogous to the layer 14 in FIG. 4. Therefore, the layer 108 in FIG. 5 is preferably an amorphous titanium nitride (TiN) layer formed as discussed with respect to FIG. 4. As previously mentioned, the collective thickness of the layers 106 and 108 will typically not exceed 400 angstroms for most applications.

Figure 6:
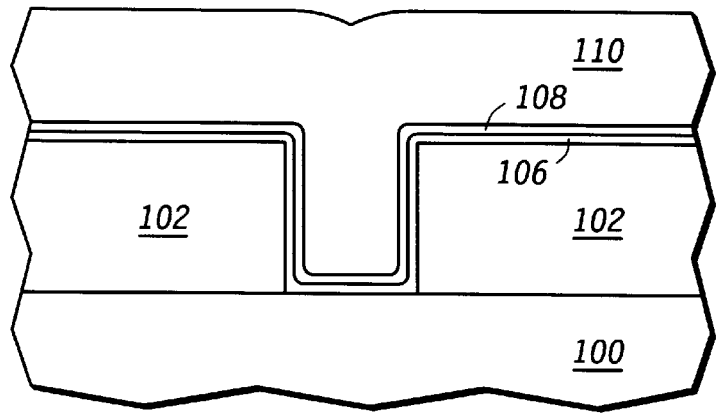

FIG. 6 illustrates that a copper layer 110 is physical vapor deposited (PVD) over a top of the barrier layers 106 and 108. In a preferred form, the layer 110 is formed in situ with the barrier materials 106 and 108. In a preferred form, the thickness of the physical vapor deposited copper layer 110 is initially between 1,000 and 3,000 angstroms. This thickness of the layer 110 is then thickened through the use of copper electroplating technology. A final thickness for the layer 110 is roughly 7,000 angstroms to 13,000 angstroms in total copper thickness.

Figure 7:
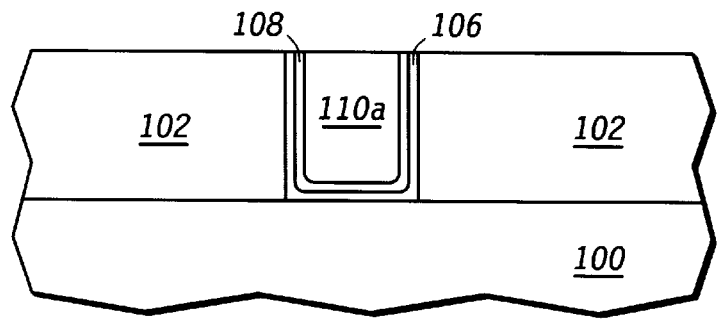

FIG. 7 illustrates that a chemical mechanical polishing (CMP) process is utilized to polish top portions of the layer 110 and top portions of the layers 106 and 108. This polishing process results in the formation of a copper single inlaid plug region 110 as illustrated in FIG. 7.

Figure 8:
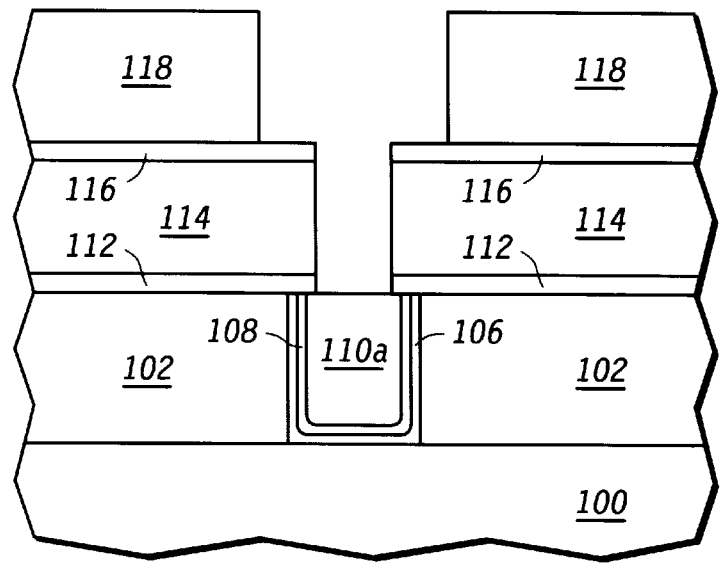
Figure 9:
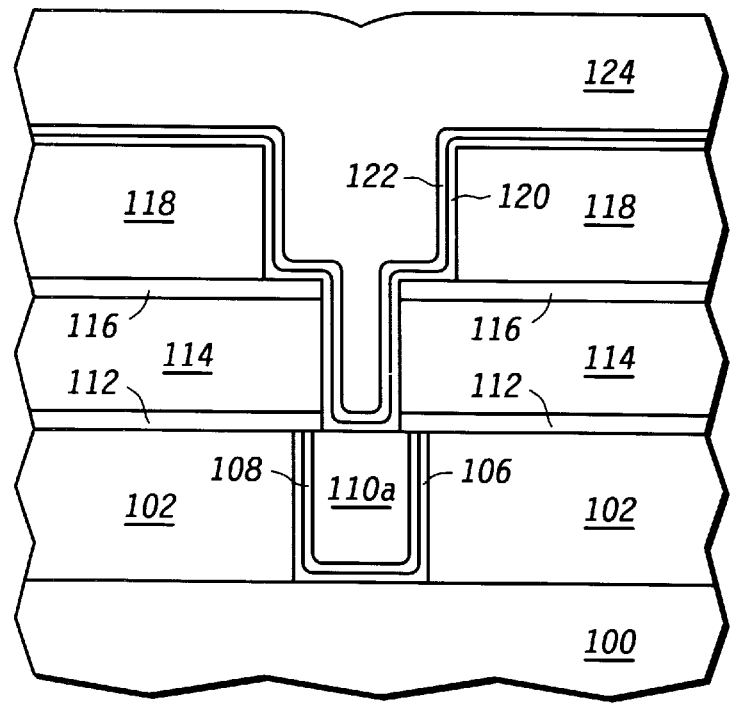
Figure 10:
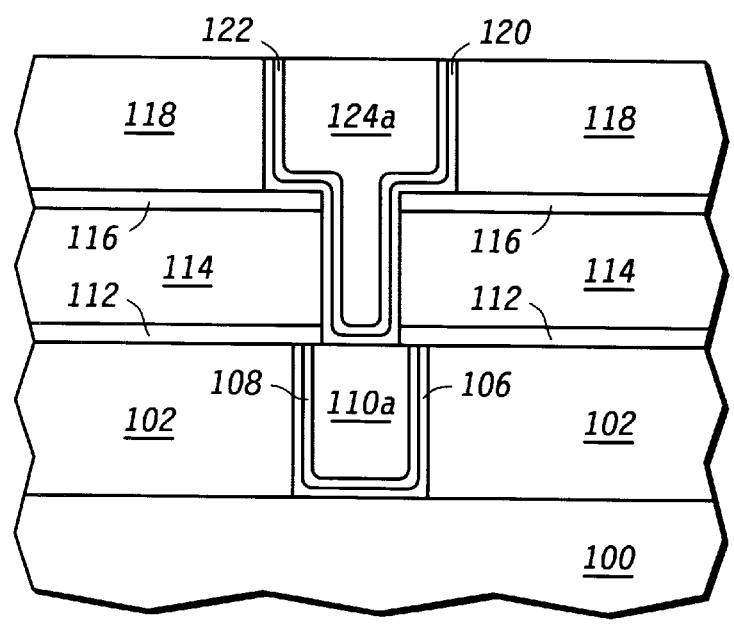

FIGS. 8–10 illustrate that the composite amorphous barrier layer taught herein can be used in either inlaid processing or dual inlaid "damascene" processing. For dual inlaid processing, FIG. 8 illustrates that an etch stop 112 is formed. Over the etch stop 112 is formed a dielectric layer 114 similar to that discussed previously for layer 102. A second etch stop layer 116 is then formed in FIG. 8. And finally, a last dielectric layer 118 is formed in a manner similar to the formation of layer 114. In a preferred form, the etch stop layer 112 is a composite of plasma enhanced nitride (PEN) and silicon oxynitride (SiON). The layer 116 is preferably a plasma enhanced nitride layer. Conventional photolithographic processing and etch technology is used to form the dual inlaid trenches illustrated in FIG. 8. It is important to note that there are many ways in which to form these trenches and any manner of formation can be used in FIG. 8.

FIG. 9 illustrates that the amorphous tantalum nitride layer 120 and the amorphous titanium nitride layer 122 are formed within the dual inlaid structure. A copper material 124 is then deposited by one or more of PVD and electroplating.

FIG. 10 illustrates that a chemical mechanical polishing process is used to remove upper portions of the layers 120 through 124 to form a dual inlaid interconnect structure comprising refractory metal barrier materials and a copper bulk.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Specifically, the copper layer taught herein may be either a copper layer, a copper alloy layer, or a copper-containing layer. Additionally, the interconnect layer taught herein may comprise any other conductive material, such as silver and/or gold. Additionally, a silicon-containing layer may be formed after formation of a copper-containing layer, where the copper-containing layer is separated from the silicon-containing layer by a composite barrier layer as taught herein.

In the claims, means-plus-function clause(s), if any, cover the structures described herein that perform the recited function(s). The mean-plus-function clause(s) also cover structural equivalents and equivalent structures that perform the recited function(s).

What is claimed is:

1. A method for forming a conductive structure, the method comprising the steps of:
   providing a silicon-containing layer;
   forming a composite barrier layer comprising a titanium nitride layer in direct contact with a tantalum nitride layer, wherein the titanium nitride layer overlies the tantalum nitride layer, wherein a thickness of the composite barrier layer does not exceed 400 angstroms; and
   forming a copper-containing layer wherein:
   the copper-containing layer is separated from the silicon-containing layer by the composite barrier layer; and the copper-containing layer is in direct contact with the composite barrier layer.

2. The method of claim 1, wherein
the titanium nitride layer is formed using by vapor deposition.

3. The method of claim 1, wherein the step of providing the silicon-containing layer and the step of forming the copper-containing layer further comprises:
forming the silicon-containing layer before the copper-containing layer wherein the copper-containing layer overlies the silicon-containing layer and is separated from the silicon-containing layer by the composite barrier layer.

4. The method of claim 1, wherein the step of providing the silicon-containing layer and the step of forming the copper-containing layer further comprises:
forming the silicon-containing layer after formation of the copper-containing layer wherein the copper-containing layer underlies the silicon-containing layer and is separated from the silicon-containing layer by the composite barrier layer.

5. The method of claim 1, further comprising the steps of:
providing a dielectric layer overlying the silicon-containing layer;
forming an opening through the silicon-containing layer and through the dielectric layer; and
chemical mechanical polishing the copper-containing layer and portions of the composite barrier layer.

6. The method of claim 1, wherein the copper-containing layer has a thickness of at least 1000 angstroms.

7. The method of claim 1, wherein the tantalum nitride layer comprises tantalum silicon nitride.

8. The method of claim 1, wherein the titanium nitride layer is amorphous.

9. A method for forming a conductive structure, the method comprising the steps of:
providing a substrate;
forming a composite barrier layer comprising a titanium nitride layer in direct contact with an amorphous layer, wherein:
the titanium nitride layer overlies the amorphous layer;
the titanium nitride layer is amorphous as deposited; and
forming a metallic layer wherein the metallic layer is separated from the substrate by the composite barrier layer.

10. The method of claim 9, wherein
the titanium nitride layer is formed by physical vapor deposition.

11. The method of claim 9, further comprising a step of forming a silicon-containing layer over the substrate, wherein:
the silicon-containing layer is formed before the metallic layer; and
the metallic layer overlies the silicon-containing layer and is separated from the silicon-containing layer by the composite barrier layer.

12. The method of claim 9, further comprising a step of forming a silicon-containing layer over the substrate, wherein:
the silicon-containing layer is formed after formation of the metallic layer; and
the metallic layer underlies silicon-containing layer and is separated from the silicon-containing layer by the composite barrier layer.

13. The method of claim 9, wherein the step of forming a composite barrier layer comprises in-situ deposition of titanium nitride, and in-situ deposition of the amorphous layer.

14. The method of claim 13, wherein the step of forming the metallic layer comprises in-situ deposition of copper.

15. The method of claim 9, further comprising the steps of:
forming a dielectric layer over the substrate;
forming a silicon-containing layer over the substrate;
forming an opening through the silicon-containing layer and through the dielectric layer; and
chemical mechanical polishing the metallic layer and portions of the composite barrier layer.

16. A method for forming a conductive structure, the method comprising the steps of:
forming a base layer;
forming a first amorphous barrier layer over the base layer, the first amorphous barrier layer being made of a first barrier material, the first amorphous barrier layer being as an amorphous seed layer for forming a second amorphous barrier layer;
forming the second amorphous barrier layer over the first amorphous barrier layer, wherein:
the second amorphous barrier layer being in direct contact with the first amorphous barrier layer;
the second amorphous barrier layer is typically formed as a crystalline material, but is formed as an amorphous material due to the presence of the first amorphous layer;
the second amorphous barrier layer being made of a second barrier material which is different from the first barrier material; and
forming a metallic layer over the second amorphous barrier layer, wherein the first and second amorphous barrier layers reduce interaction between the metallic layer and the base layer wherein the metallic layer is greater than or equal to 1000 angstroms thick and is in direct contact with the second amorphous layer.

17. A method as in claim 16, wherein the metallic layer comprises copper.

18. A method as in claim 16, wherein the first amorphous barrier layer comprises tantalum nitride.

19. A method as in claim 16, wherein the second amorphous barrier layer comprises titanium.

* * * * *